(12) United States Patent
Anderson et al.

(10) Patent No.: US 12,073,145 B2
(45) Date of Patent: Aug. 27, 2024

(54) MODULAR VEHICLE SOUND SYSTEM

(71) Applicant: Metra Electronics Corporation, Holly Hill, FL (US)

(72) Inventors: Jason Anderson, Port Orange, FL (US); William H. Jones, Jr., Holly Hill, FL (US)

( * ) Notice: Subject to any disclaimer, the term of this patent is extended or adjusted under 35 U.S.C. 154(b) by 0 days.

(21) Appl. No.: 17/522,049

(22) Filed: Nov. 9, 2021

(65) Prior Publication Data

US 2023/0143653 A1 May 11, 2023

(51) Int. Cl.
*H04R 3/00* (2006.01)
*G06F 3/16* (2006.01)
*H03F 3/21* (2006.01)
*H03G 3/30* (2006.01)

(52) U.S. Cl.
CPC .............. *G06F 3/162* (2013.01); *H03F 3/21* (2013.01); *H03G 3/3005* (2013.01); *H04R 3/00* (2013.01); *H03F 2200/03* (2013.01); *H03G 2201/103* (2013.01); *H04R 2499/13* (2013.01)

(58) Field of Classification Search
CPC ........ G06F 3/162; H03F 3/21; H03F 2200/03; H03G 3/3005; H03G 2201/103; H04R 3/00; H04R 2499/13

USPC ............................................................ 381/86
See application file for complete search history.

(56) References Cited

U.S. PATENT DOCUMENTS

| | | | | |
|---|---|---|---|---|
| 5,974,333 | A * | 10/1999 | Chen | B60R 11/0241 455/346 |
| 2005/0069153 | A1* | 3/2005 | Hall | H04S 7/307 381/103 |
| 2009/0105858 | A1* | 4/2009 | Bonglovi | H03G 5/165 700/94 |
| 2016/0188876 | A1* | 6/2016 | Harris | G06N 20/00 726/23 |
| 2017/0103773 | A1* | 4/2017 | Chowdhury | G06F 3/162 |
| 2022/0416729 | A1* | 12/2022 | Azadet | H03F 3/21 |

* cited by examiner

*Primary Examiner* — Carolyn R Edwards
*Assistant Examiner* — Friedrich Fahnert
(74) *Attorney, Agent, or Firm* — J. Wiley Horton

(57) ABSTRACT

A modular vehicle sound system that can be upgraded or reconfigured by changing a plug-in module. In the advanced-capability embodiments the invention combines the functions of a vehicle data bus interface, a digital signal processor, and an amplifier. In the advanced-capability embodiments the invention provides a wireless interface with a separate digital device that can be used to control the inventive amplifier.

14 Claims, 18 Drawing Sheets

FIG. 16

| Connected to AX-DSP-X Metra 17587A39 (-65) | | WARNING: Settings have changed – Make sure to 'Lock Down' before Exiting App | |
|---|---|---|---|
| SETUP INSTRUCTIONS | BLUETOOTH CONNECTION | CONFIGURATION | OUTPUTS |
| CROSSOVER ADJUST | EQUALIZER ADJUST | DELAY ADJUST | LEVELS |

*Distance from each speaker to "Head" position (in inches)*

| | |
|---|---|
| Left Front | 37 |
| Right Front | 54 |
| Left Rear | 27 |
| Right Rear | 46 |
| Sub Woofer | 57 |
| Left Front Tweeter | 26 |
| Right front Tweeter | 45 |

Measure the distance from each speaker to the desired 'Head' position and enter those values in the corresponding boxes. Maximum distance is 99".

— 142

MODULAR VEHICLE SOUND SYSTEM

BACKGROUND OF THE INVENTION

1. Field of the Invention

This invention relates to the field of vehicle sound systems. More specifically, the invention comprises a modular amplifier and signal processor whose characteristics can be altered using a plug-in module.

2. Description of the Related Art

The present invention comprises a modular audio amplifier that can be configured to perform different roles in an existing vehicle sound system or in an aftermarket vehicle sound system. FIGS. 1-3 illustrate three exemplary prior art vehicle sound systems. It is of course impossible to describe the many existing permutations and the three illustrations provided should be viewed as representing a much larger set of possibilities. The present invention can be used with many different types of prior art systems.

FIG. 1 illustrates a high-end vehicle sound system as provided by an original equipment manufacturer ("OEM"). OEM systems are typically not designed to function with components from aftermarket manufacturers. As an example, OEM head unit 12 is often made in an irregular shape intended to blend into an overall dash design. The OEM head unit includes a display screen, along with various knobs and buttons. These user-input are employed to select the desired audio source (satellite radio, conventional radio, BLUETOOTH streaming, etc.) and alter the characteristics of the sound produced (volume, tone, etc.).

The space available in the dash is often limited. As a result, many OEMs now separate the power amplifier from the head unit. In the example shown, OEM head unit 12 acts as an audio source. OEM amplifier 22 receives the audio signal from OEM head unit 12 and amplifies it to an output level suitable for driving the vehicle's speakers.

The term "amplifier" in this context may be somewhat misleading because OEM amplifiers often include many components in addition to a conventional power amplifier. The OEM amplifier shown is configured to take in two channels (right and left) and drive a seven-speaker sound system. The speakers are: RH dash speaker 24, LH dash speaker 26, RH door speaker 28, LH door speaker 30, RH rear speaker 32, LH rear speaker 34, and woofer 36. Each of these speakers is configured to efficiently reproduce a particular frequency range. The dash speakers in this example are tweeters. The door and rear speakers are mid-range speakers. The woofer is of course intended to handle only low frequencies.

OEM amplifier 22 includes several "crossovers" configured to produce output signals in the proper frequency range for each of the driven frequencies. The term "crossover" can include both active and passive devices. In general, it encompasses a set of high-pass filters (HPFs), band-pass filters (BPFs), and low-pass filters (LPFs). The LPFs pass only the lower frequencies from the left and right input channels. In this example the low frequencies from the left and right input channels are fed into a single output channel that drives woofer 36 (it is common to use a single channel for low frequency sounds since stereo effects are negligible for low frequency sounds).

The BPFs pass mid-range frequencies that are suitable for driving the door speakers 28,30 and the rear speakers 32,34. The HPFs pass higher frequencies that are suitable for driving the dash speakers 24,26. All these crossover functions are well understood to one skilled in the art.

There are two broad approaches used by OEMs when the amplifier is separated form the head unit. In the first approach, volume control remains with the head unit. The user adjusts the volume—typically using a knob—and this adjustment increases or decreases the amplitude of the audio signal sent to the separate amplifier 22. The amplifier then applies a fixed gain in the power amplification process.

In the second approach, OEM head unit 12 sends a fixed level audio signal to the separate power amplifier. The power amplifier then provides a variable gain to set the desired output level for the speakers. This second approach is in fact illustrated in FIG. 1. OEM head unit 12 sends fixed level audio 16 to OEM amplifier 22. The user still sets a desired sound level using OEM head unit 12 (such as by turning a knob). However, rather than varying its audio output level, the OEM head unit transmits a separate signal to the separate amplifier. This separate signal instructs the amplifier to increase or decrease its gain.

The separate signal sent from the OEM head unit to the OEM amplifier is usually a digital signal. Since nearly every vehicle now includes a digital data bus, it is convenient to send the signal over the vehicle's digital data bus. Most vehicle data buses are now some type of "CAN" (Controller Area Network) bus. The first widely-used system implementing the digital CAN paradigm was developed by Robert Bosch. GmbH in the early 1980's. Bosch called its system the "CAN bus," and this has now become a generic term. Bosch actually released its protocol to the Society of Automotive Engineers with the initial hope of creating a unified communication platform across all vehicle makes and models, though Bosch did not propose to offer the standard free of licensing fees.

The goal of a uniform standard has largely gone unrealized, with the various vehicle manufacturers adopting proprietary systems instead. Even so, the basic characteristics of the original CAN standard are found in most vehicle operating protocols. In general, a CAN network is a "masterless" system in which various microcontrollers communicate without the need for one defined "host" computer. This is a significant feature, as a modern vehicle may contain as many as 70 separate electronic control units. The two most significant control units are typically the Engine Control Unit ("ECU") and the Body Control Unit ("BCU"). However, there are many other controllers for things such as a blower fan, an air conditioning compressor, power mirrors, air bags, air-inflated suspension "springs," an automatic transmission, and even small things like the dimming functions of a rear-view mirror.

The control of the factory audio equipment is now also done using digital commands over the CAN bus. When the user turns the volume knob on OEM head unit 12, a digital signal is sent over data link 18 to vehicle data bus 14. The signal is broadcast generally on the vehicle data bus, but it contains preamble information indicating that it is intended for OEM amplifier 22. Data link 20 carries the signal to OEM amplifier 22, where it is decoded and acted upon (to increase or decrease the gain).

FIG. 2 shows an alternate version of the system depicted in FIG. 1. In the example of FIG. 2, a fixed level audio signal 16 is again sent from OEM head unit 12 to OEM amplifier 22. A digital signal is also sent to instruct the OEM amplifier. However, rather than using the vehicle data bus, direct data link 40 is used between the OEM head unit 12 and OEM amplifier 22. The direct data link may assume many forms.

One commonly used data protocol is the A2B protocol developed by Philips Semiconductor.

The examples of FIGS. 1 and 2 present a problem for the user seeking to upgrade the audio performance of a vehicle. The user often wishes to retain the OEM head unit, since it is an integral part of the dash assembly and replacing it will alter the appearance of the vehicle's interior. It is still desirable to replace the OEM amplifier, however, since aftermarket units typically have higher output and better overall performance. In addition, aftermarket amplifiers are often highly customizable whereas the OEM amplifiers are not.

A well-known disadvantage of the OEM amplifier is that it provides fixed equalization functions. The term equalization refers to selective gain adjustments within discrete bands of frequencies for each channel. The equalization values used in an OEM amplifier are often dictated by the speakers used. Aftermarket speakers are available that vastly outperform OEM speakers. However, the equalization settings of the OEM amplifier cannot be changed. As one example, the OEM amplifier may be set up to attenuate lower frequencies at high volume levels because the woofer used in the OEM system is power-limited. A user seeking to upgrade the sound system can replace the OEM woofer with a larger unit capable of handling much higher sound pressures. However, the potential of the new woofer will go largely unrealized because of the fact that the equalization settings within the OEM amplifier cannot be changed.

FIG. 3 presents a known prior art solution to these problems. The OEM amplifier is removed. CAN audio interface 44 receives the fixed level audio 16 from OEM head unit 12. The CAN audio interface also includes a data link 20 so that it can receive messages from the CAN bus 14 that were originally intended for the OEM amplifier (such as "volume up" or "volume down" commands). CAN audio interface 44 receives fixed level audio signal 16 and produces variable level audio signal 46—with the output level being changed in response to digital CAN commands the audio interface 44 decodes from the vehicle data bus. There are numerous CAN audio interface products on the market. The one depicted in FIG. 3 provides six output channels of variable level audio. These would customarily be RH/LH "front" channels, RH/LH "rear" channels, and RH/LH "woofer" channels.

In most cases OEM equalization settings will still be present even in variable level audio signals 46, because the equalization settings are added in the audio source (OEM head unit 12). In a few cases the equalization settings are added in the OEM amplifier. In those cases the equalization settings will be removed with the removal of the OEM amplifier.

However, the equalization settings are most often added in the OEM head unit and the system depicted in FIG. 3 is configured to address this problem. Digital signal processor ("DSP") 48 receives variable level audio signal 46 from CAN audio interface 44. A set of analog-to-digital converters take the input signals into the digital domain. While the signals are in the digital domain, the DSP applies independent equalization and gain functions to each signal. The functions of the DSP are accessible to a user, who can set the parameters as desired. As one example, the output signals from the OEM head unit may have an increased gain setting in the range from 200 Hz to 5 kHz. The DSP can be set to remove this gain and completely flatten the frequency response.

The operation of a DSP is familiar to those skilled in the art. Details as to the operation of such devices are disclosed in U.S. Pat. No. 9,875,078. U.S. Pat. No. 9,875,078 is hereby incorporated by reference for purposes of this disclosure.

The "back end" of the DSP has a set of digital-to-analog converters that takes the signal back to the analog domain. The particular DSP shown has seven output channels. The DSP can individually adjust the equalization and gain settings for each of these channels. The DSP output channels are routed to four separate aftermarket amplifiers 50,52,54, 56. Each of these is a two channel power amplifier, though only one of the two channels is used for amplifier 56. In this prior art configuration amplifier 50 drives speakers 24 and 26. Amplifier 52 drives speakers 28 and 30. Amplifier 54 drives speakers 32 and 34, Amplifier 56 drives speaker 36 (a woofer).

The prior art system of FIG. 3 has the advantage of retaining the OEM head unit and thereby retaining the original look of the dash. It also has the advantage of digital signal processing that can be used to remove unwanted OEM equalization settings and other issues. Unfortunately, the use of a separate CAN audio interface, DSP, and multiple power amplifiers produces an expensive system. It also produces a system that is cumbersome to install, integrate, and tune. It is desirable to provide the functionality of the system of FIG. 3 in a more integrated system. It is also desirable to provide tis functionality in a system that can be easily upgraded to provide more and more advanced functions. The present invention provides such as system.

BRIEF SUMMARY OF THE PRESENT INVENTION

The present invention comprises a modular vehicle sound system that can be upgraded or reconfigured by changing a plug-in module, in the advanced-capability embodiments the invention combines the functions of a vehicle data bus interface, a digital signal processor, and an amplifier. In the advanced-capability embodiments the invention provides a wireless interface with a separate digital device that can be used to control the inventive amplifier.

BRIEF DESCRIPTION OF THE SEVERAL VIEWS OF THE DRAWINGS

FIG. 16 is a graphical view showing a representative graphical user interface.

REFERENCE NUMERALS IN THE DRAWINGS

Figure 1:
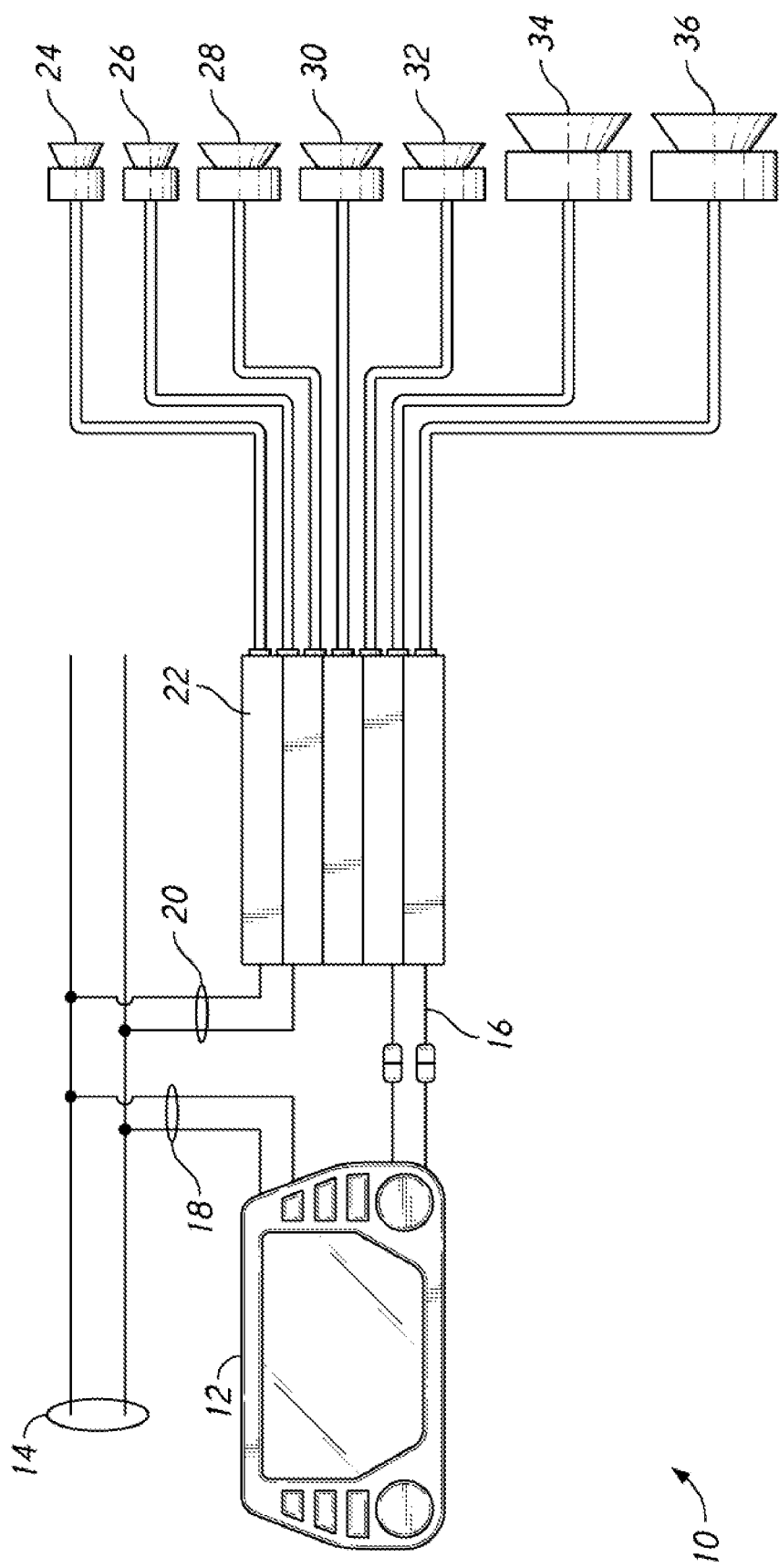
FIG. 1 is a schematic view, showing a prior art OEM sound system using a separate power amplifier.
Figure 2:
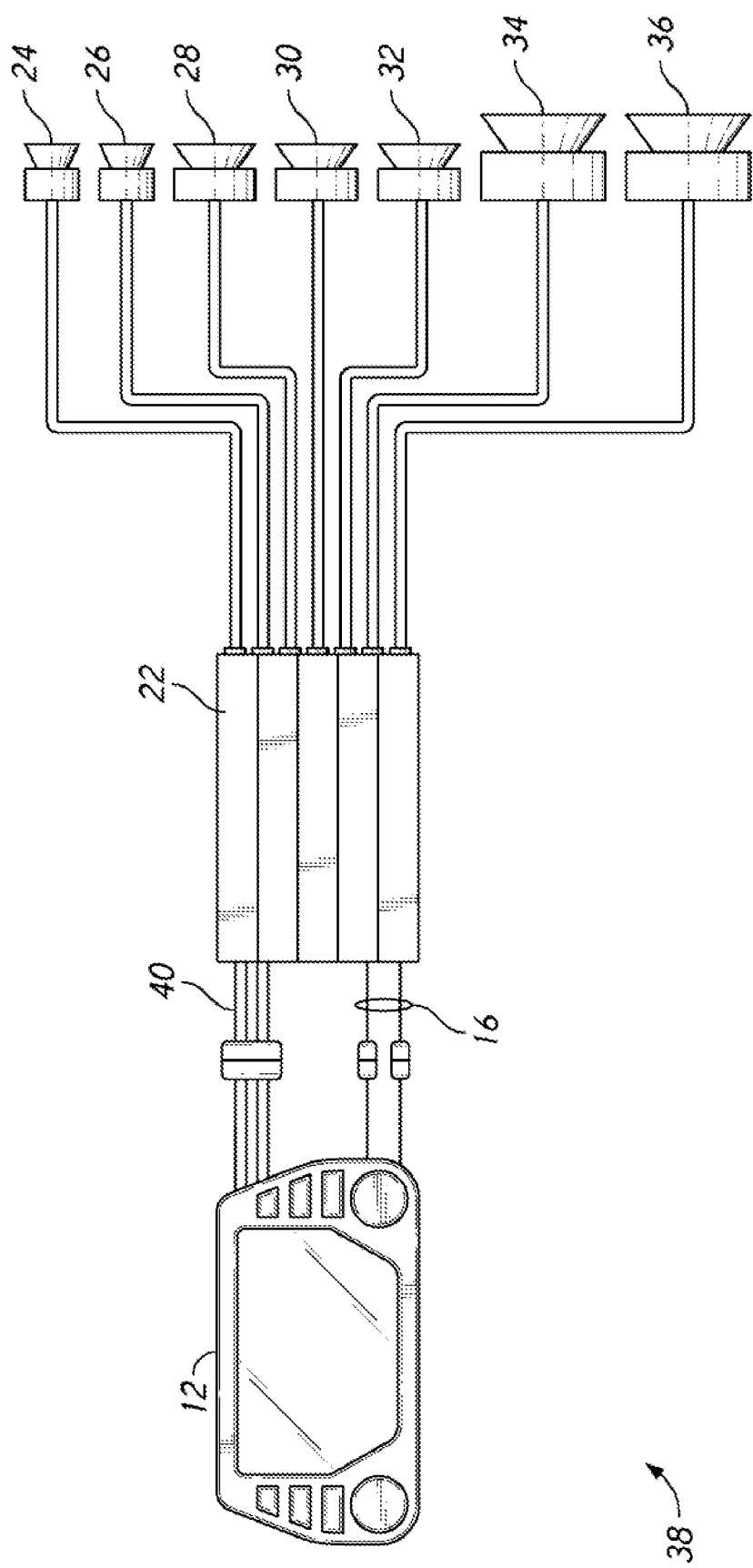
FIG. 2 is a schematic view, showing a prior art OEM sound system using a separate power amplifier.
Figure 3:
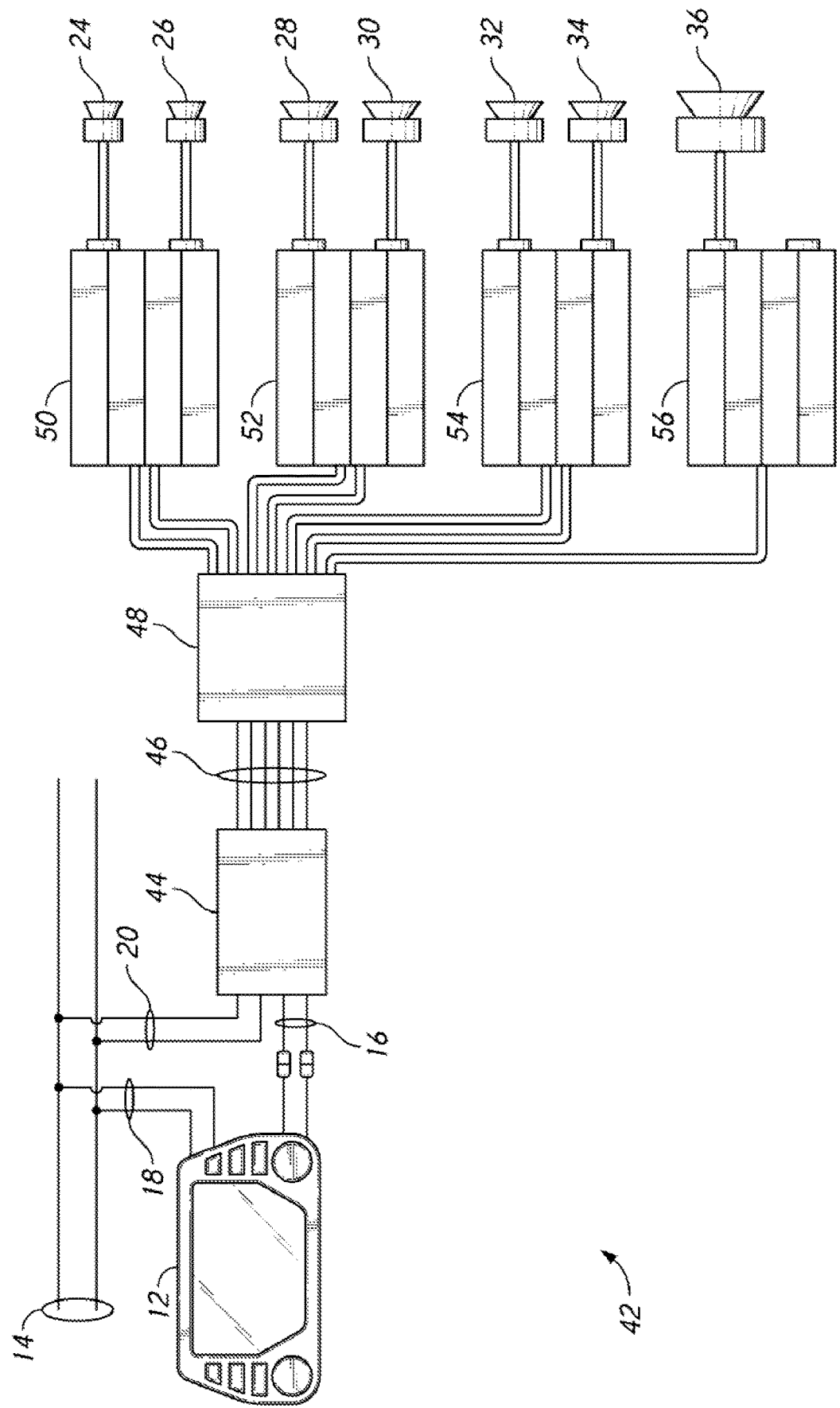
FIG. 3 is a schematic view, showing the addition of a digital signal processor to a prior art sound system.

10 OEM sound system
12 OEM head unit
14 vehicle data bus
16 fixed level audio
18 data link
20 data link
22 OEM amplifier
24 RH dash speaker
25 RH rear tweeter
26 dash speaker
27 LH rear tweeter
28 RH door speaker
30 LH door speaker
32 RH rear speaker
34 LH rear speaker
36 woofer
37 RH woofer
38 OEM sound system
39 LH woofer
40 direct data link
42 custom sound system
44 CAN audio interface
46 variable level audio
48 digital signal processor
50 aftermarket amplifier
52 aftermarket amplifier
54 aftermarket amplifier
56 aftermarket amplifier
58 modular amplifier
60 chassis
62 plug-in module
64 receiver
66 contact array
68 grip feature
70 leading edge
72 contact array
74 antenna
76 aftermarket head unit
77 slave amplifier
78 variable level audio
79 slave amplifier
80 audio link
82 audio link
84 data link
86 data link
88 inputs
90 signal processing
92 amplifier section
94 outputs
96 audio output
98 data output
100 processor
102 on-board memory
104 interface
106 interface
108 processor
110 memory
112 bluetooth interface
114 analog-to-digital converter
116 splitter
118 equalizer
120 delay module
122 digital-to-analog converter
124 preamplifier
126 power amplifier
128 digital device
130 GUI
132 crossover adjustment display
134 speaker designation
136 filter type designation
138 slider
140 equalizer display
142 delay adjustment display
144 connector
146 input cable assembly
148 power inputs
150 power jack
152 speaker output jack
154 data jack
156 data jack
158 input board
160 input board
162 input board
164 input board
166 input board

DETAILED DESCRIPTION OF THE INVENTION

The present invention can be physically realized in a wide variety of ways, and the invention should not be viewed as limited to any particular physical implementation. However, it is beneficial to the reader's understanding to provide some specific examples. The following descriptions provide these specific examples but should not be viewed as limiting.

Figure 4:
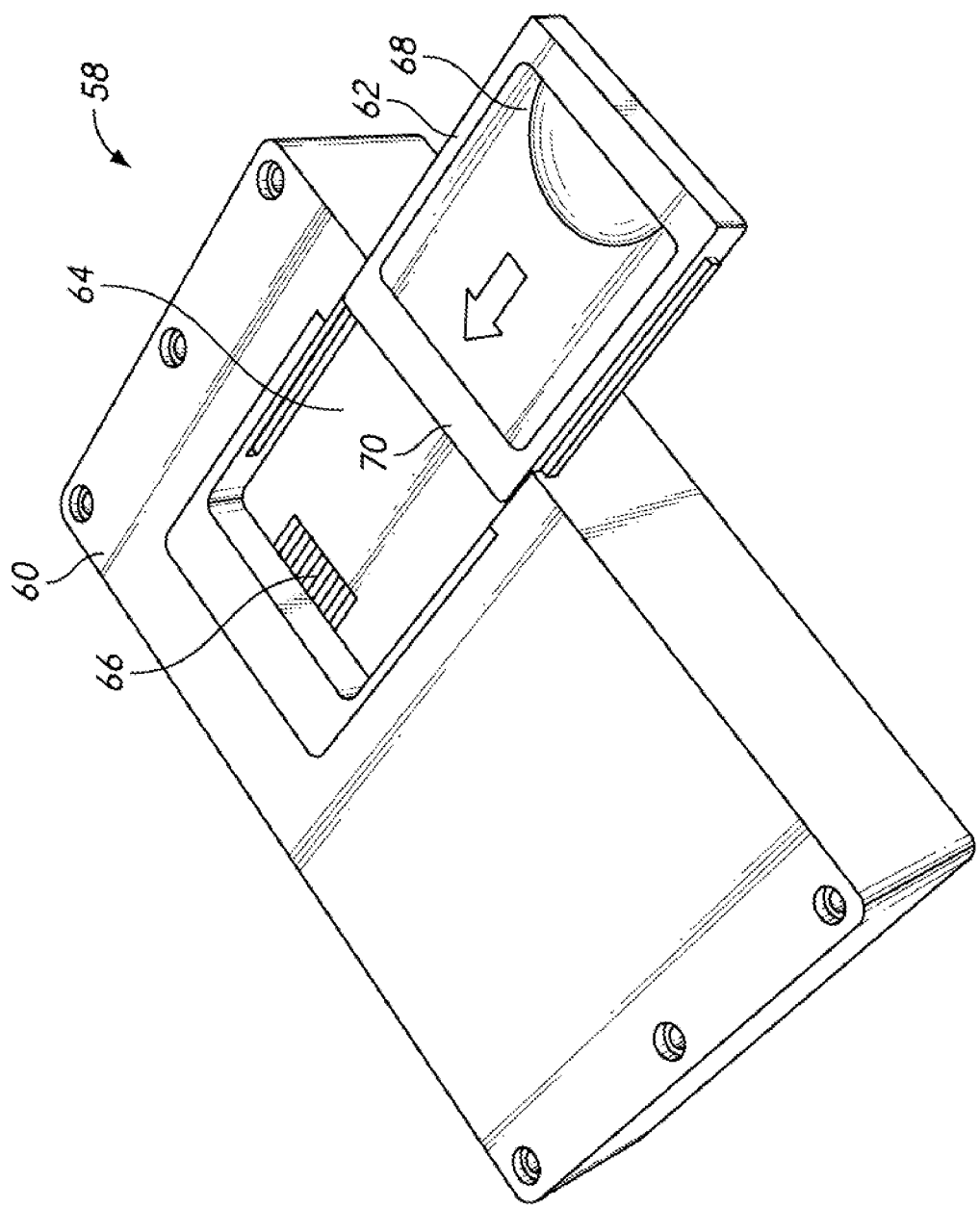
FIG. 4 is a perspective view, showing an embodiment of the present invention.
Figure 5:
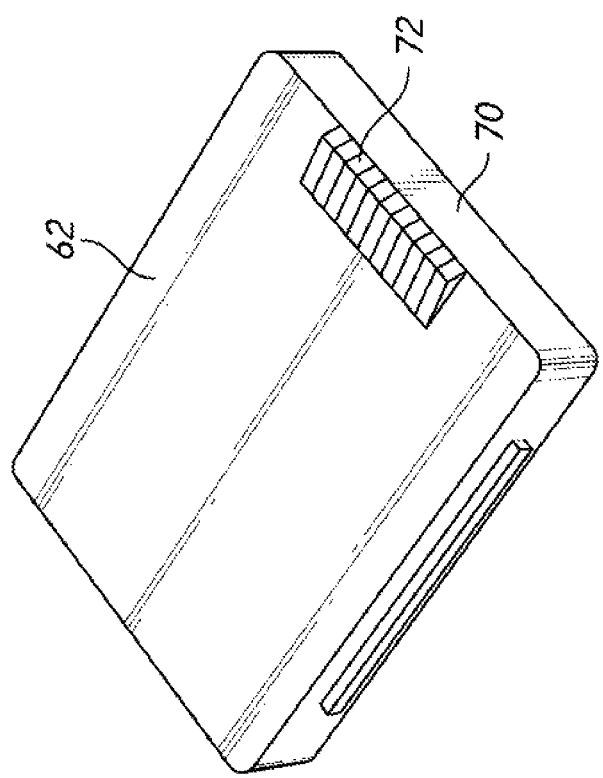
FIG. 5 is a perspective view, showing a plug-in module such as used in the present invention.

A desirable feature of the present invention is modular upgradability. A user can purchase and install a limited-capability version of the invention. At a later time the user can upgrade the invention by substituting a new plug-in module. FIGS. 4 and 5 illustrate this upgradability. FIG. 4 depicts an embodiment of inventive modular amplifier 58. Chassis 60 includes a receiver 64. Receiver 64 is configured to receive a plug-in module 62. The plug-in module in this example includes lateral rails that slide into slots on the lateral sides of receiver 64. The plug-in module is pushed into place in the direction indicated by the arrow and then captured by retaining features such as plastic snaps. Contact array 66 on chassis 60 makes electrical contact with a similar contact array on the plug-in module. Grip features 68 allow the user to grasp the plug-in module and pull it free of the chassis in order to substitute a new plug-in module (typically done to upgrade the features of the modular amplifier).

FIG. 5 shows the same plug-in module as depicted in FIG. 4 flipped over to expose its underside. Leading edge 70 is the portion that first slides into the receiver in the chassis. Contact array 72 is configured to provide multiple electrical contacts with contact array 66 in chassis 60. The contact array preferably includes flexible and resilient contact fingers. The plug-in module can be configured to include a variety of components, including a processor(s), a memory, and external communication devices—such as a BLUETOOTH chipset.

Figure 6:
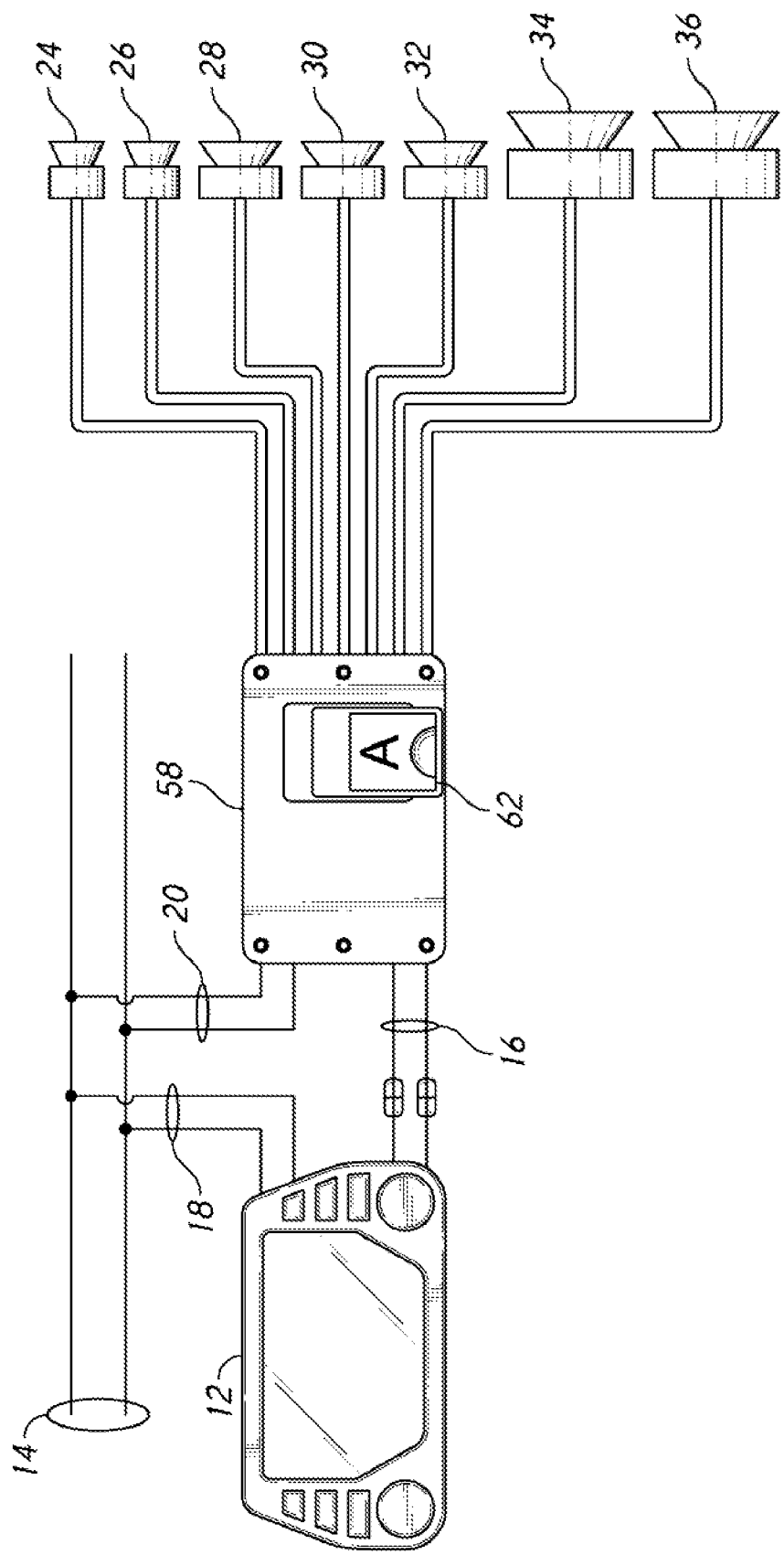
FIG. 6 is a schematic view, showing a first operational state of the present invention.

FIGS. 6-10 illustrate some of the upgrades that are possible by swapping the plug-in module. FIG. 6 shows a low-capability configuration. A first type of plug-in module 62 (labeled "A") is plugged into modular amplifier 58. In this configuration modular amplifier 58 has been substituted for an OEM amplifier (similar to the configuration shown in FIG. 1). The audio source is OEM head unit 12, which feeds fixed level audio signal 16. Volume adjustments are made by a signal transmitted from OEM head unit 12 to vehicle data bus 14. Data link 20 is provided from the vehicle data bus 14 to modular amplifier 58 in FIG. 1.

Data link 20 is usually just a twisted pair of conductors attached to a vehicle CAN bus. However, as discussed in the introductory section of this application, vehicle CAN busses are not standardized and use a wide variety of transmission formats. In the inventive embodiment of FIG. 6, plug-in module "A" includes a memory containing the proper format for the vehicle in which modular amplifier 58 is installed. As an example, if the modular amplifier is installed in a General Motors vehicle, plug-in module A will be programmed with one or more of the varieties of the GMLAN data format used by the CAN buses in General Motors vehicles. The information provided by the plug-in module A allows the modular amplifier to decode messages on vehicle data bus 14 and adjust the gain of the modular amplifier in response to "volume up" or "volume down" data signals. If the user wishes to install the modular amplifier in a different type of vehicle, he or she removes plug-in module A and substitutes a new plug-in module containing the data format information for the new type of vehicle. Thus, the plug-in module provides a vehicle make-specific interface allowing the modular amplifier to decode signals received over its data link 20.

Figure 7:
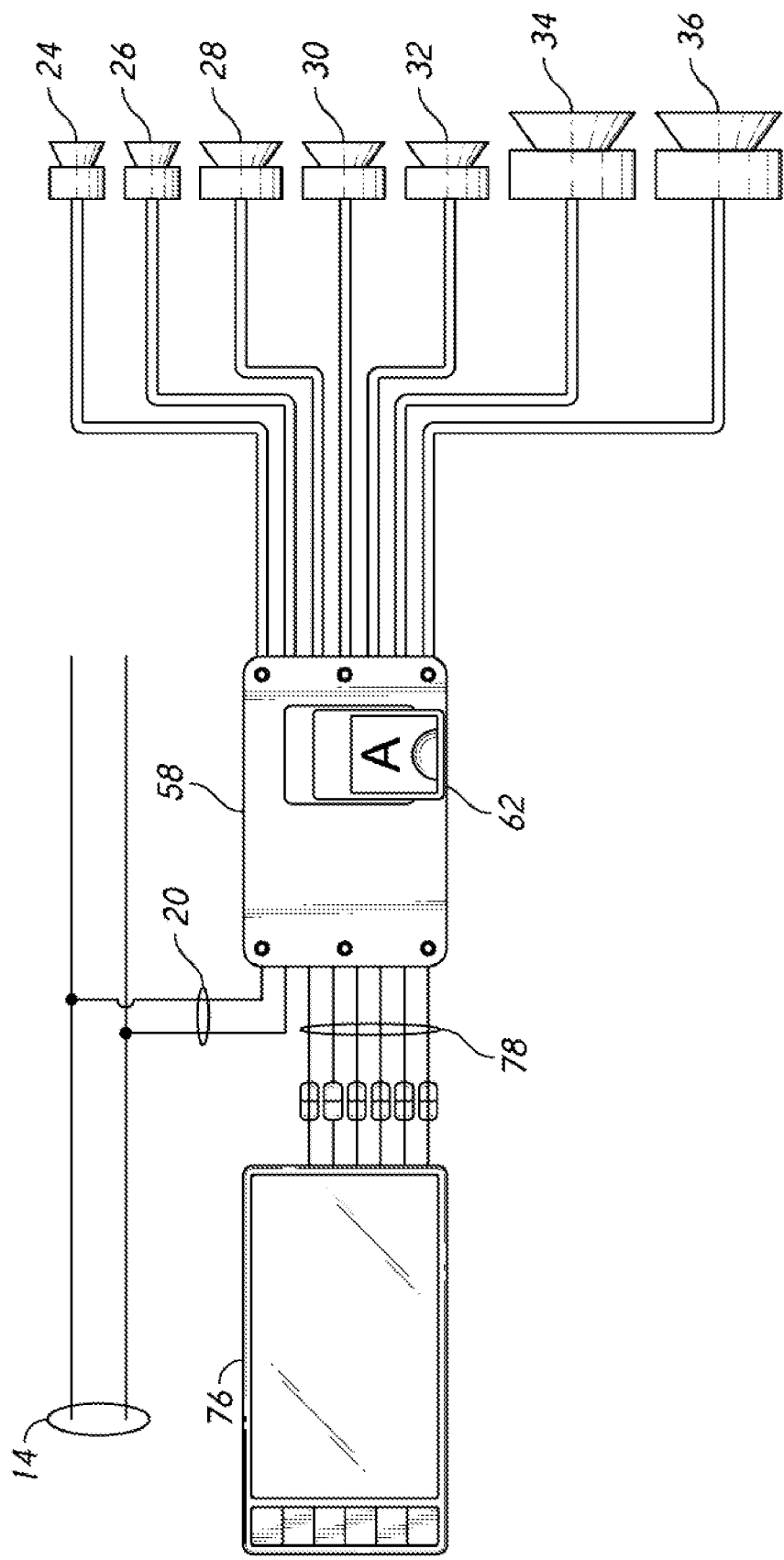
FIG. 7 is a schematic view, showing the configuration of FIG. 6 with an aftermarket head unit.

FIG. 7 shows a similar configuration, except that an aftermarket head unit 76 has been substituted for the OEM head unit. The aftermarket head unit is also an audio source. However, it produces variable level audio signal 78. Thus, the overall gain of the sound system is controlled by the aftermarket head unit with no data messages being used for this purpose. Data link 20 is still provided between the modular amplifier 58 and the vehicle data bus 14 because other signals may still need to be fed into modular amplifier 58.

A good example of non-volume signals is the various warning "chimes" that alert a driver when a door or tailgate is opened. These "chimes" usually originate with the body control unit ("BCU"). The BCU sends a digital signal commanding a chime. OEM amplifiers typically respond to this signal by retrieving the appropriate sound file from memory and then running it through the amplifier and out to the speakers, Modular amplifier 58 is configured to decode these "chime" signals and respond like the OEM amplifier. The modular amplifier retrieves an appropriate sound file from memory, amplifies it, and sends the amplified signal to the speakers.

Figure 8:
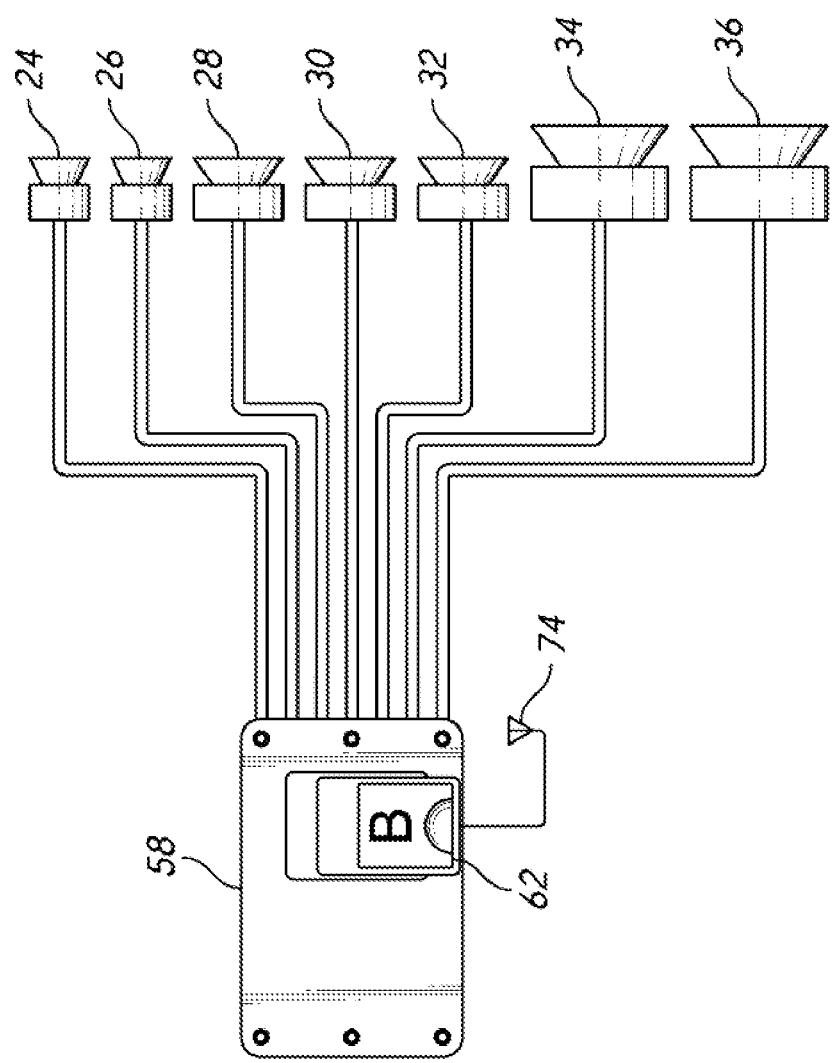
FIG. 8 is a schematic view, showing a second operational state of the present invention.

FIG. 8 shows another embodiment in which the capabilities have been altered by substituting plug-in module "B" for plug-in module "A." Plug-in module B includes a wireless communication chip set that allows modular amplifier 58 to communicate with an external digital device—such as a smart phone. Antenna 74 is used to facilitate wireless communication. This antenna is shown schematically. In most examples the antenna is embedded in the housing of the plug-in module and is not separately visible though a visible version can also be provided. An antenna can also be provided in the chassis of the modular amplifier itself.

In the example of FIG. 8 the wireless chip set is configured to use the BLUETOOTH communication format. As one example, plug-in module B can contain an nRF52840 processor made by Nordic Semiconductor of Trondheim, Norway. This particular processor includes advantageous internal radio frequency communication capability. It can, for example, communicate with other devices using the BLUETOOTH communication protocol. It also includes programmable internal memory allowing it to be customized for the performance of many tasks.

In the configuration of FIG. 8 no audio source that is integral to the vehicle is provided. Instead, a separate phone is used as an audio source, with the data being streamed to modular amplifier 58 via BLUETOOTH pairing. This configuration is particularly advantageous for off-road vehicles that do not include a head unit.

Figure 9:
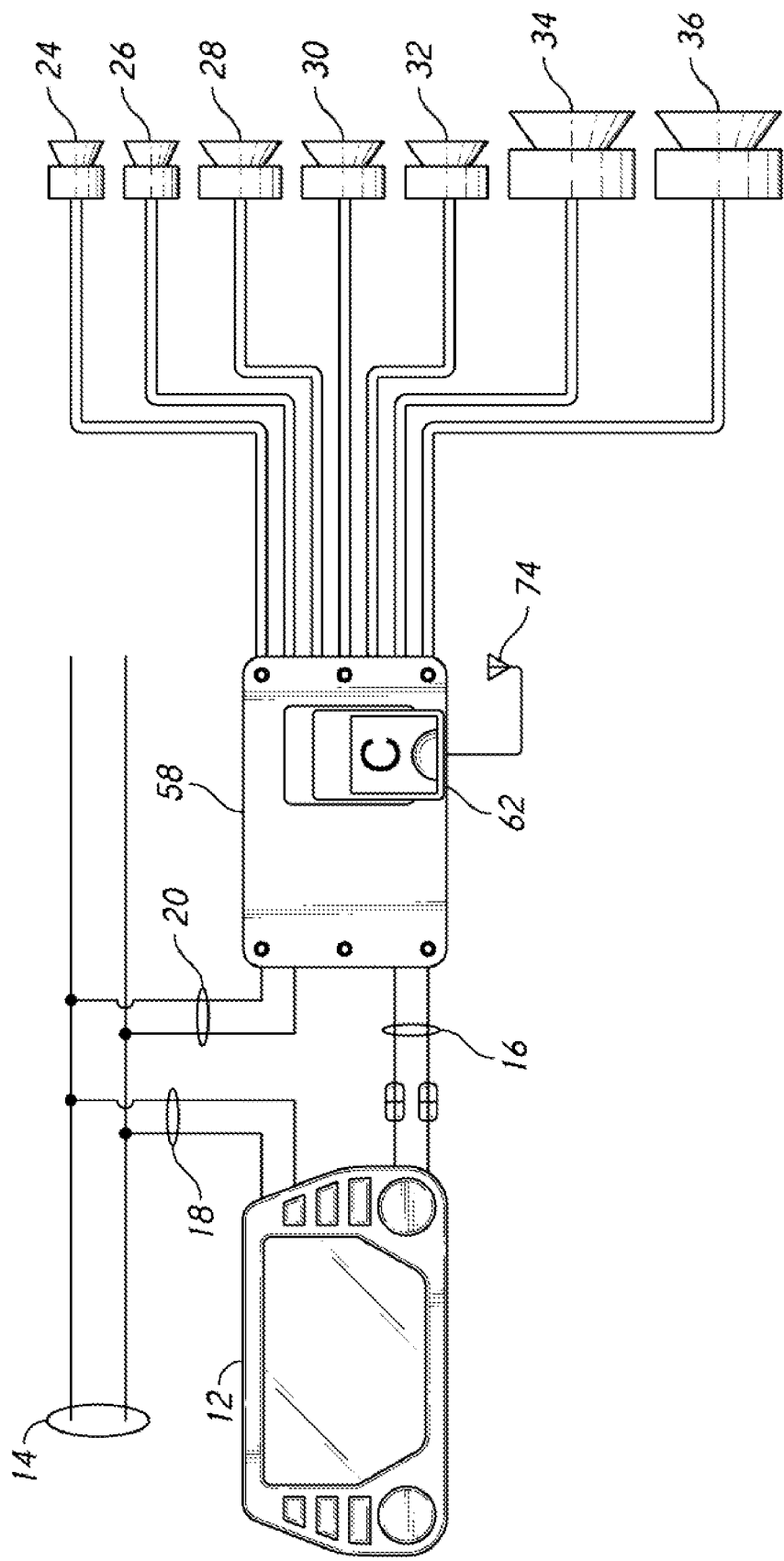
FIG. 9 is a schematic view, showing a third operational state of the present invention.

FIG. 9 shows another configuration of the invention having enhanced capabilities. In this version plug-in module "C" has been installed in the receiver in modular amplifier 58. Plug-in module C adds the functionality of a digital signal processor ("DSP") to modular amplifier 58, The DSP is controlled using an application running on an external device, such as a smartphone or tablet. Wireless connectivity is used for the link—such as BLUETOOTH. The chipset for performing the DSP function may actually be contained on plug-in module C. However, the hardware to perform the DSP functions may be included in the modular amplifier 58 itself, with the installation of plug-in module C performing the function of unlocking the use of this hardware. As an example, plug in module C can provide a software key, hardware key, or combination key that unlocks the DSP functionality already found in the modular amplifier.

In the example of FIG. 9, fixed level audio 16 is fed into the modular amplifier from OEM head unit 12. The audio signal 16 includes factory-set equalization levels as described previously. The DSP functions provided in modular amplifier 58 are used to remove the factory-set levels and provide equalization that is best suited to drive the speakers being used in an upgraded system.

Figure 10:
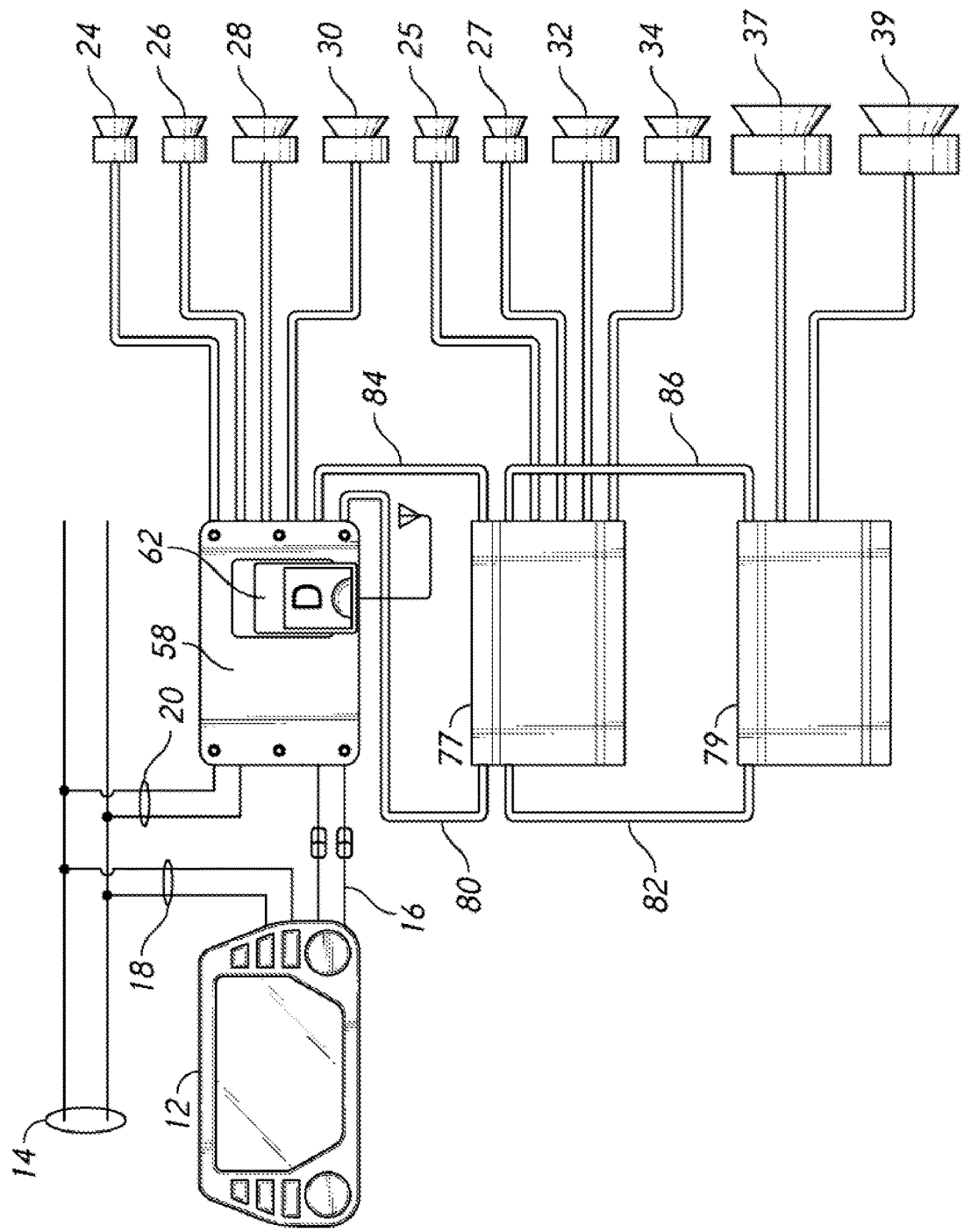
FIG. 10 is a schematic view, showing a fourth operational state of the present invention.

FIG. 10 shows a configuration of the invention having even more enhanced capabilities. In this version plug-in module "D" has been installed in the receiver in modular amplifier 58. The installation of plug-in module D allows modular amplifier 58 to assume multiple roles in a more advanced system. The system shown includes 10 separate speakers. These are: RH dash speaker 24, LH dash speaker 26, RH door speaker 28, LH door speaker 30, RH rear tweeter 25, LH rear tweeter 27, RH rear speaker 32, LH rear speaker 34, RH woofer 38, and LH woofer 39.

Modular amplifier 58 contains a power amplifier. However, in the case of a powerful and sophisticated sound system, it is often desirable to use multiple power amplifiers. Modular amplifier 58 provides this capability. The audio source in the example of FIG. 10 is once again OEM head unit 12 providing fixed level audio 16. Modular amplifier 58 receives digital data signals over data link 20. Included in these signals are "volume up" and "volume down" commands sent by the OEM head unit. The modular amplifier responds to these signals by adjusting the system gain.

Modular amplifier 58 provides a power output signal to drive RH dash speaker 24, LH dash speaker 26, RH door speaker 28, and LH door speaker 30. However, the remaining six speakers in the system are driven by other power amplifiers. Slave amplifier 77 drives RH rear tweeter 25, LH rear tweeter 27, RH rear speaker 32, and LH rear speaker 34. Slave amplifier 79 drives RH woofer 37 and LH woofer 39. Modular amplifier 58 includes output audio links and output data links. Thee can be "daisy-chained" (connected in parallel) to multiple external amplifiers. Audio link 80 provides an audio signal output from modular amplifier 58 to slave amplifier 77. Audio link 82 provides the same audio signal to slave amplifier 79.

Data link 84 provides a data signal from modular amplifier 58 to slave amplifier 77. Data link 86 provides a parallel connection to feed the same data to slave amplifier 79. The data links can be bi-directional, depending on the data transmission format used. Modular amplifier 58 provides the only interface needed with the vehicle data bus. Thus, a single-point interface is provided that eliminates the need for this expensive functionality in the slave amplifiers. As for the prior examples, wireless communication is used to link the modular amplifier with a separate controlling device such as a smartphone. BLUETOOTH pairing is the preferred approach.

Modular amplifier 58 preferably also provides a single-point for the application of digital signal processing ("DSP"). The audio signals sent to the slave amplifiers on audio links 80,82 are post-DSP (meaning that the desired equalization functions have already been applied). Having said that, it is still possible to provide gain functions in the slave amplifiers. Data links 84,86 can provide gain adjustment commands that are implemented by slave amplifiers 77,79. The reader should bear in mind that—in some communication formats—the audio and data links can be combined on a single link.

While the invention is not limited to any particular data transmission format, the reader's understanding may benefit from an explanation of some of the possibilities. The MOST format can be used if the links are carried over optical fiber. MOST stands for Media Oriented System Transport. This is a serial communication system for transmitting audio, video, voice, and data signals via plastic optical fiber (POF, as opposed to glass optical fiber). POF is much more robust under bending or flexing than glass. Though POF has a higher signal attenuation than glass, it works well for transmissions over a short distance (such as found in a vehicle like in a car). MOST network can manage multiple devices (up to 64) in a ring configuration (In a ring each node connects to two and only two other nodes—creating a single path around the ring).

The IEBus format is another possibility. This standard was originally developed by NEC in Japan, where it became a de facto standard for car audio and navigation systems. IEBus is a master/slave system. A good example (historically) is an OEM head unit being the master and a remote CD changer being the slave. A more recent example is an OEM head unit being the master and a remote NAV system being the slave. IEBus controllers are packaged as chip sets, making them easy to integrate into other systems.

Still another example is the A2B format (often written $A^2B$). A2B transceivers allow an I2C host to access all transceivers in a system (I2C is a well-known synchronous multi-master, multi-slave communications bus invented by Philips Semiconductor). A2B is ideal for transporting digital audio, with configurable 44.1 kHz or 48 kHz frame rates and a data rate of up to 50 Mbps.

Figure 11:
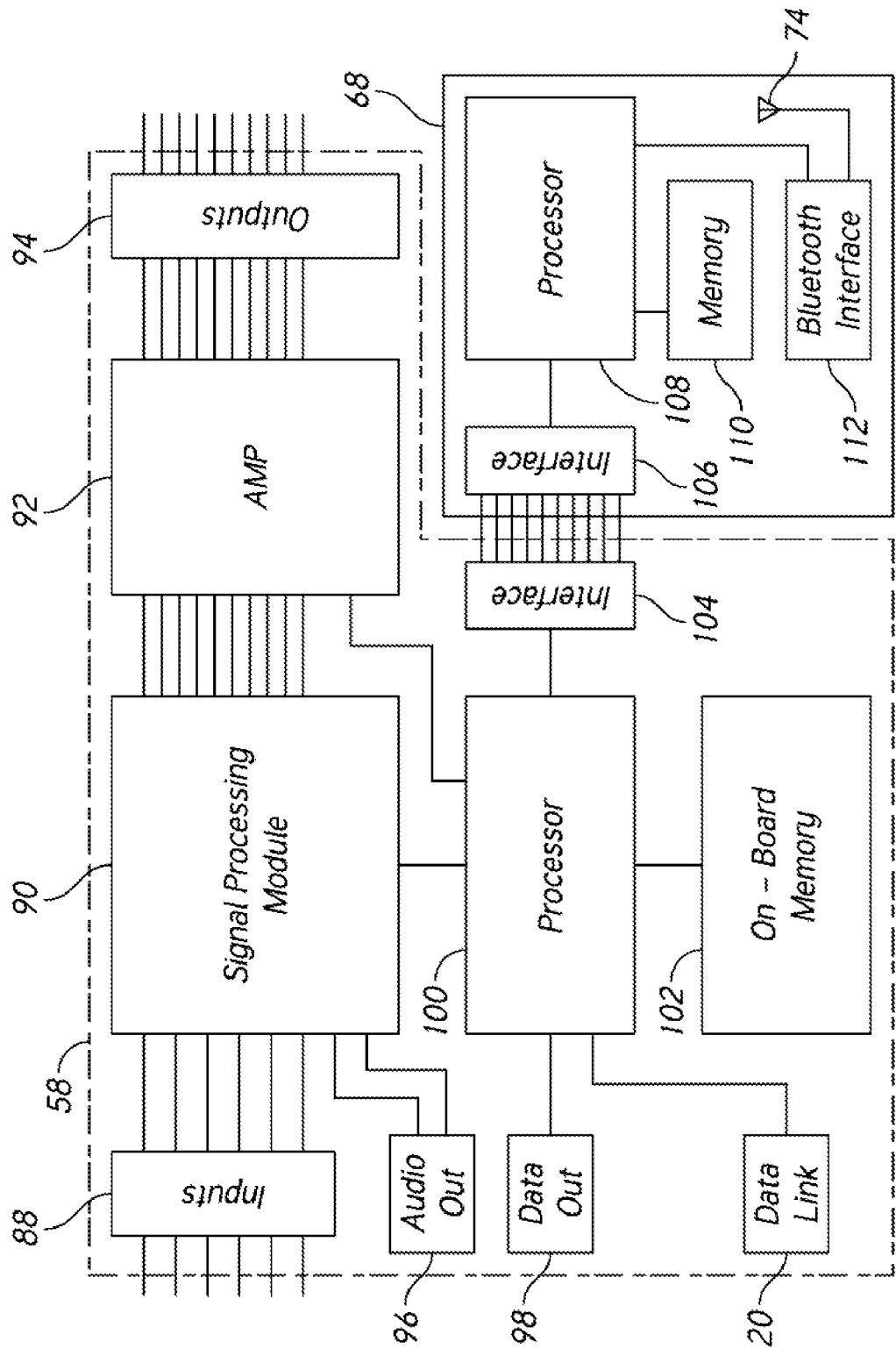
FIG. 11 is a schematic view, showing representative internal components of the inventive modular amplifier.
Figure 12:
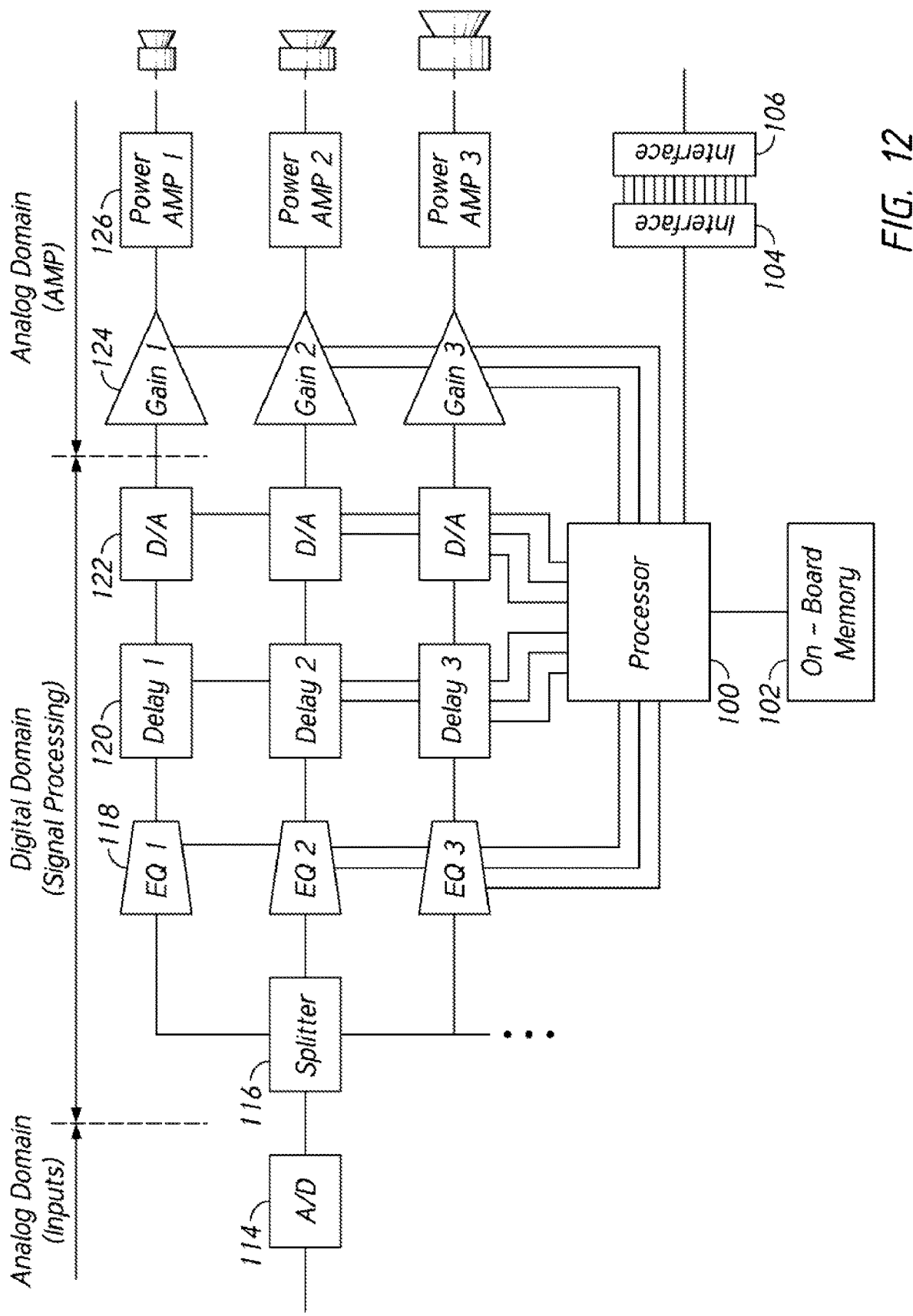
FIG. 12 is a schematic view, showing representative internal components of the inventive modular amplifier.

The electronics contained within modular amplifier 58 and the plug-in modules 62 can be configured in a wide variety of ways. FIGS. 11 and 12 provide an illustrative configuration. FIG. 11 provides a schematic (at a block diagram level) of modular amplifier 58 with plug-in module 62 in place. Power supply and regulation components are not shown for purposes of visual clarity.

Input module 88 receives up to six input channels. In the view, a single line is shown for each channel though each channel of course contains two conductors. The six input channels are fed into signal processing module 90, which is a digital signal processor. Main processor 100 retrieves and runs software from on-board memory 102. On-board memory 102 includes the program or programs to be run as well as current values for the parameters used in the program or programs.

Data output 98 carries digital data from processor 100. Data output 98 can in some instances be a bi-directional module that allows data to be sent into processor 100 as well. Data link 20 provides communication with the vehicle data bus as explained previously. This data link carries messages into the processor (such as volume up and volume down commands). The processor responds to these messages—such as by altering the gain of amplifier 92.

Signal processing module 90 has 10 output channels feeding into amplifier 92. Amplifier 92 is a power amplifier that passes 10 amplified channels through output module 94 and on to the speakers being driven. Processor 100 controls signal processing module 90 in addition to amplifier 92. The control of the signal processing module will be explained in detail subsequently.

Plug-in module 62 communicates with processor 100 through interfaces 104,106. The particular plug-in module 62 shown in FIG. 11 also contains a processor 108 and associated memory 110. Processor 108 communicates with BLUETOOTH interface 112 (which is typically a set of chips). Additional functionality may be provided to the modular amplifier by processor 108. Alternatively, the additional functionality can be provided within the modular amplifier, with the use of this added functionality being unlocked by a "software key" found on plug-in module 62.

FIG. 12 provides additional detail as to the components within signal processing module 90 and how they are controlled by processor 100. The six input channels coming from input module 88 (in FIG. 11) are shown on the left of the view. The processing of one of these six channels is shown in FIG. 12. The processing of the other five channels is the same, using additional components.

The signals coming in pass through analog-to-digital converter 114. This converts the signals from the analog domain to the digital domain. Splitter 116 splits the signal into as many separate processing channels as desired. In this example, three separate processing channels are shown. Each processing channel ultimately drives a single speaker in this example.

An equalizer function 118 is provided for each processing channel. In this example, each equalizer function splits the signal into 31 distinct frequency bands and allows the user to separately assign a gain to each band. A delay function 120 is provided for each channel as well. This allows the user to assign a time delay to each speaker individually, in order to produce a correct "sound image" for a particular location in the vehicle (typically the position of the driver's head).

Once the equalization and delay functions are applied to each channel, the signal passes through a digital-to-analog converter 122 to return it to the analog domain. A variable gain amplifier 124 is provided for each channel. These are pre-amplifiers under the control of processor 100. The signal leaving the gain amplifiers 124 are then fed through power amplifiers 126 and out to the speakers. The reader will thereby appreciate how processor 100 controls the digital signal processing in one example.

FIGS. 13 through 16 depict a graphical user interface (GUI) configured to control the digital signal processing functions of the present invention. Those skilled in the art will know that a wide variety of GUIs could be provided, and the version shown is therefore properly viewed as being one example among many possibilities.

Figure 13:
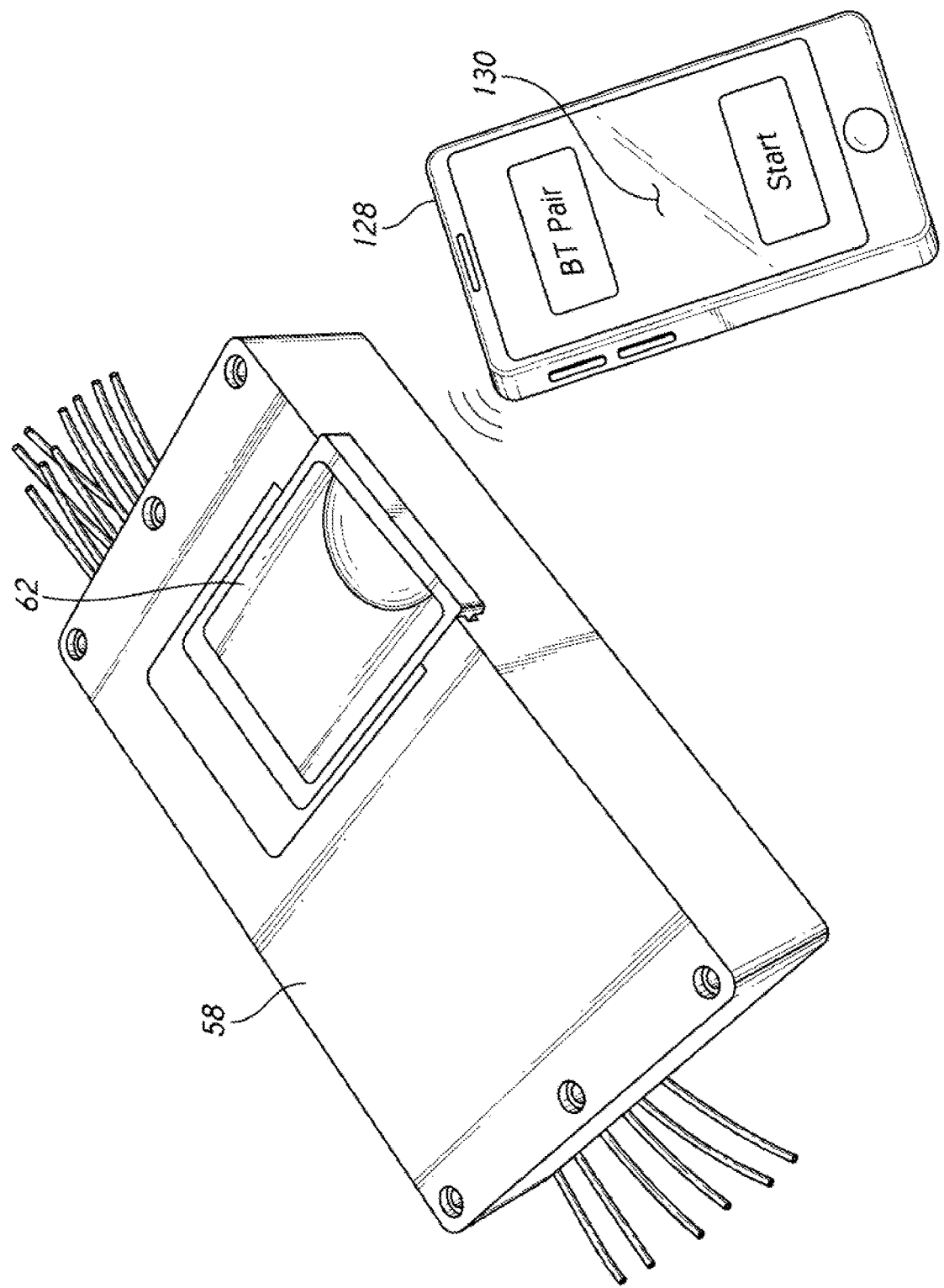
FIG. 13 is a perspective view, showing the inventive modular amplifier being paired with an external digital device.

FIG. 13 shows a digital device 128 with a touchscreen display. GUI 130 is provided on the touchscreen display. Digital device 128 is linked via BLUETOOTH to the plug-in module 62 installed in modular amplifier 58. The devices are shown in close proximity. In actuality the modular amplifier will often be installed behind a vehicle's dash and the digital device will be some distance away—such as 1 to 2 meters.

Figure 14:
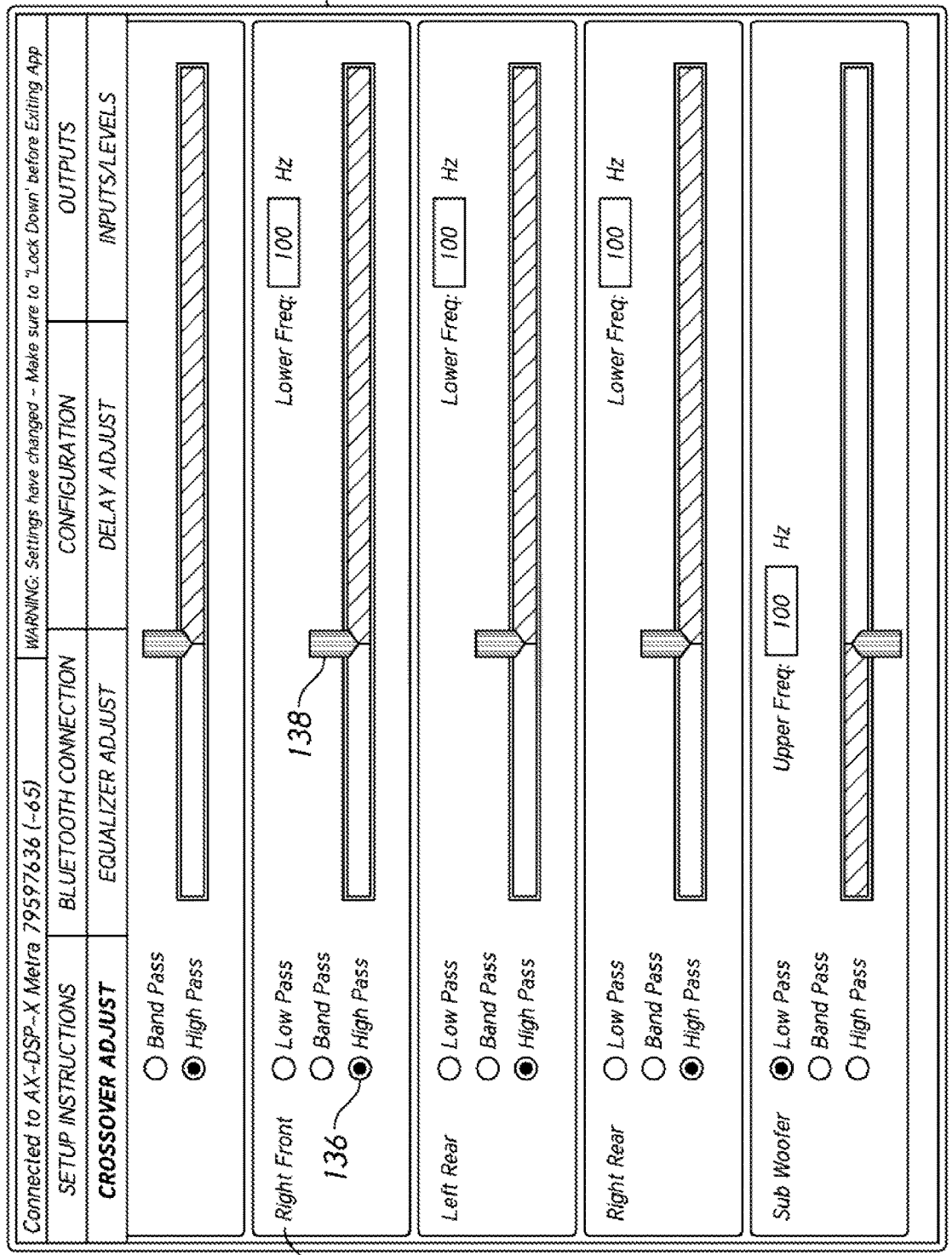
FIG. 14 is a graphical view showing a representative graphical user interface.

The digital device will often be a smartphone or a tablet. The tablet is preferred in many cases because of its larger display. FIG. 14 shows an additional page of the GUI called up on the controlling digital device. This page—designated as crossover adjust display 132—is used to select filter types and set crossover points for each speaker using nomenclature that is familiar to audio technicians. Speaker designator 134 assigns a processing channel to a speaker. Filter type designator 136 selects a filter type to assign to the channel (low pass filter, band pass filter, or high pass filter). Slider 138 then sets the cross over point for the filter applied. As an example, for the channel applied to the right front speaker, a crossover of 100 is set. Only frequencies at or above 100 Hz are sent through this channel. One advantage of filtering in the digital domain is that the "roll off" can be vertical so that no lower frequencies are passed at all.

Figure 15:
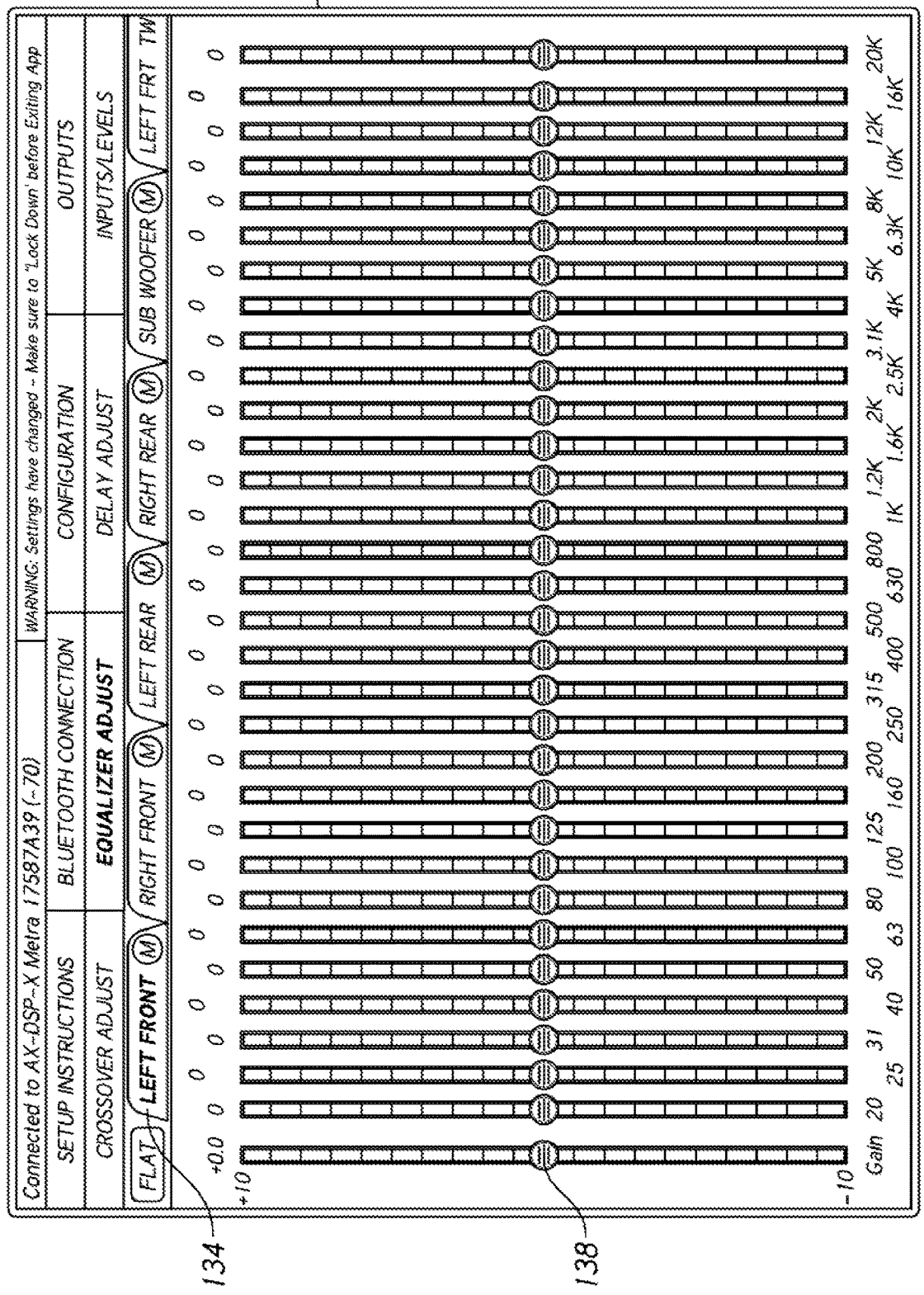
FIG. 15 is a graphical view showing a representative graphical user interface.

FIG. 15 shows a different page within the GUI—equalizer display 140. An equalizer display can be called up for each channel. Gain can be set for each frequency band. This example uses 31 discrete frequency bands so 31 adjustable sliders 138 are provided (along with an overall gain slider). Some of the bands can be removed depending on the application of the settings on the crossover page (or greyed out).

FIG. 16 shows an additional page within the GUI—delay adjustment display 142. This page allows the technician to enter a measured distance from the driver's head position to each individual speaker. The software then uses this information to assign a time delay to a particular channel driving a particular speaker. Thus, rather than having a user enter an actual time delay, the software allows the user to enter a measured distance and the software then calculates the proper time delay.

Many other pages and features can be provided within the GUI, These features allow the user to unlock all the capabilities of the modular amplifier. As an example, the GUI could also store different sets of parameters for different users. These could then be called up and loaded as desired. A "sound image" group of settings could be installed in which the speaker delay is set for the position of a passenger.

Figure 17:
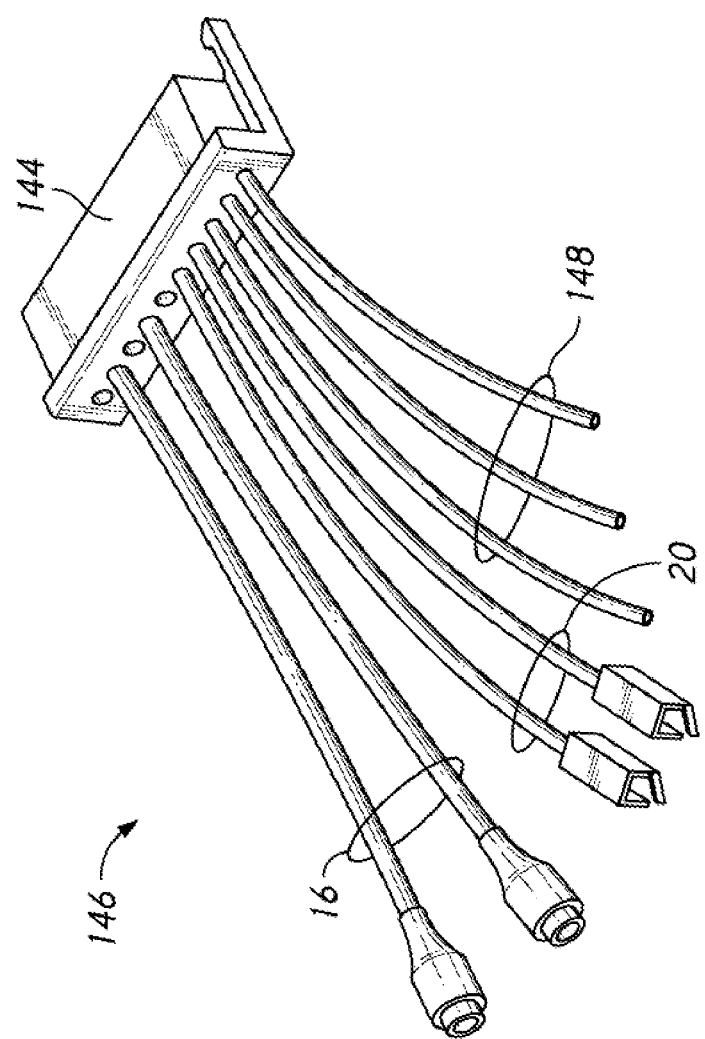
FIG. 17 is a perspective view, showing a representative cable assembly configured for use with the present invention.
Figure 18:
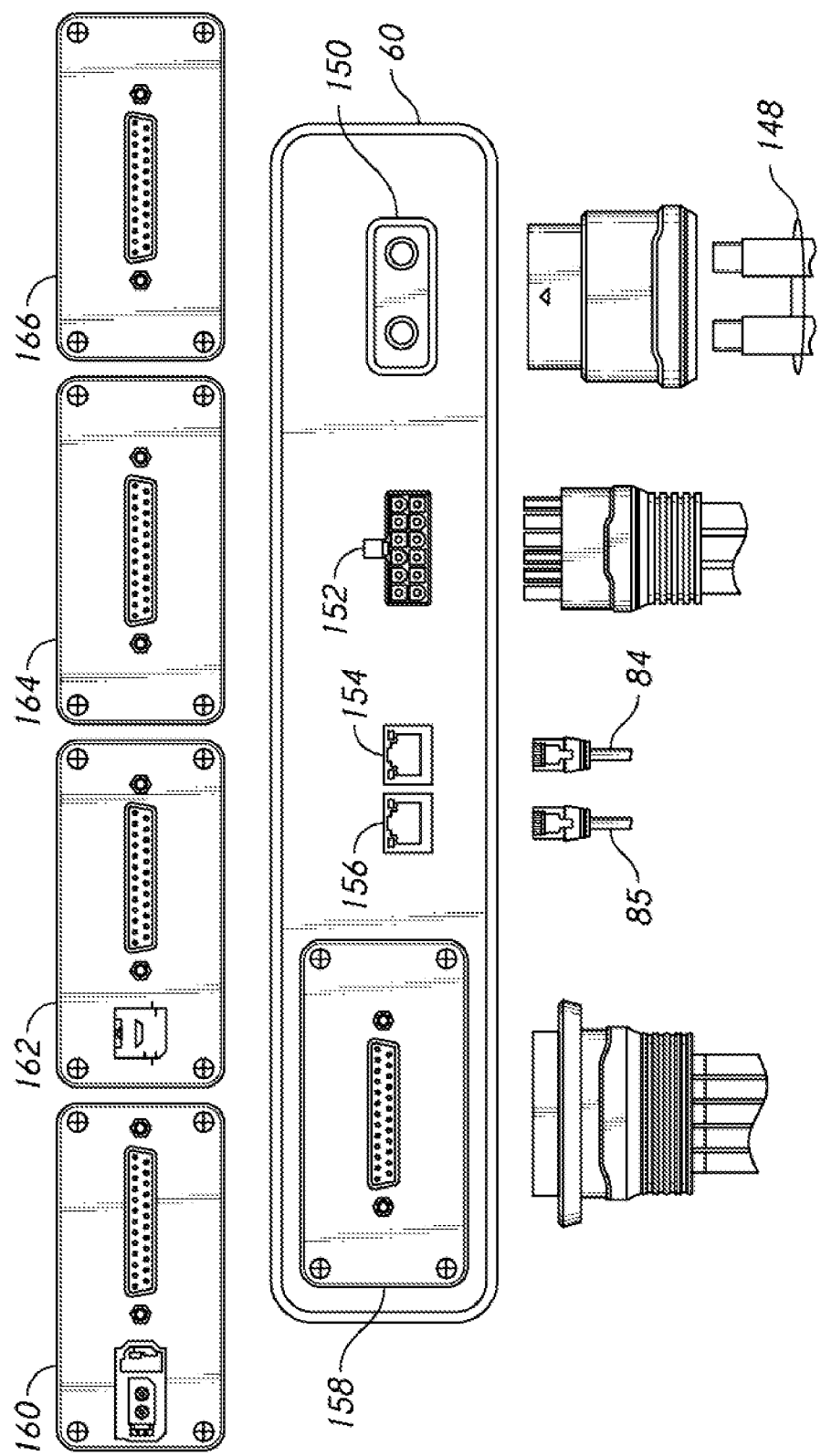
FIG. 18 is an elevation view, showing a jack panel incorporating a modular input board as used in an embodiment of the present invention.

FIGS. 17 and 18 depict exemplary hardware arrangements. It is advantageous to provide cable assemblies that facilitate the installation of the modular amplifier within a particular vehicle or class of vehicles. FIG. 17 depicts an input cable assembly 146 that is configured for use with the amplifier configuration of FIG. 6. In the configuration of FIG. 6, modular amplifier 58 requires a fixed level audio 16 input (with two channels), a data link 20 input, and a switched power input.

FIG. 17 shows an input cable assembly configured to provide these inputs. Power inputs 148 are simple wires configured to be spliced into the vehicle's existing wiring harness (one constant +12V, one switched +12V, and one ground). Fixed level audio signal 16 is carried by the two cables having RCA-jack terminations. Data link 20 is carried by two conductors having splice-in terminations allowing them to be spliced into the vehicle's existing CAN bus wiring. All these conductors lead into connector 144. A suitable receptacle for connector 144 is provided on the modular amplifier. Thus, the user makes the connections with the individual conductors and then connects these to the modular amplifier by plugging connector 144 into a socket on the modular amplifier.

FIG. 18 depicts an exemplary set of connectors that can optionally be provided on the modular amplifier. Chassis 60 in this example includes a detachable input board 158 having a standard receptacle for receiving an input wiring harness. Data jacks 154,156 are provided for data links 84,85. Speaker output jack 152 accommodates a wiring harness for the speakers that are driven by the modular amplifier. Power jack 150 accommodates the power inputs.

Different input boards can be provided for different jack configurations. Input board 160 is used if the MOST format is employed. Input board 162 is used if the A2B format is employed. Input board 164 is used if the CANBUS, SPDIF, MOST, and IEBUS formats are used. Input board 166 is used if the standard inputs plus BLUETOOTH are present. These input board are preferably made modular so that they can be swapped in chassis 60. The ability to swap input boards allows the modular amplifier to be easily adapted to different communication formats.

The invention can include many features and options, alone or in combination. These include:
1. The communication protocol needed for the modular amplifier to decode messages on the vehicle data bus can be stored on the plug-in module;
2. The communication protocol needed for the modular amplifier to decode messages on the vehicle data bus can be automatically determined using the methods disclosed in co-owned U.S. Pat. Nos. 8,014,920 and 8,214,105; and
3. The input boards (FIG. 18) can be made removable and replaceable by a user in order to alter the configuration of the modular amplifier (in a manner similar to swapping the plug-in module).

Although the preceding descriptions contain significant detail, they should not be construed as limiting the scope of the invention but rather as providing illustrations of the preferred embodiments of the invention. Those skilled in the art will know that many other variations are possible without departing from the scope of the invention. Accordingly, the scope of the invention should properly be determined with respect to the following claims rather than the examples given.

We claim:

1. In a vehicle sound system having a plurality of speakers for transmitting sound, an amplifier system comprising:
   (a) a head unit mounted in said vehicle, said head unit outputting audio signals;
   (b) a modular amplifier mounted remotely from said head unit and connected to said head unit in order to receive said audio signals from said head unit, including,
   (i) a plug-in module receiver,
   (ii) a processor,
   (iii) a memory,
   (iv) a power amplifier, configured to output an amplified audio signal to said plurality of speakers,
   (v) a data link to an external vehicle data bus, (vi) a signal processing module receiving said audio signals from said head unit, processing said signals, and outputting them to said power amplifier;

(c) a removable plug-in module configured to plug into said plug-in module receiver in said modular amplifier, including a plug-in module memory;

(d) said plug-in module including a wireless communication chipset;

(e) a smartphone that is separate from said head unit and said modular amplifier, said smartphone running a graphical user interface, whereby a user can use said graphical user interface while said smartphone is physically separated from said modular amplifier to wirelessly send commands to said plug-in module, with said signal processing module responding to said commands; and (f) said commands controlling at least one of an adjustable set of crossover filters, an adjustable multi-frequency band equalizer, and an adjustable delay function in said signal processing module.

2. The amplifier system as recited in claim 1, wherein said plug-in module is also configured to add a digital signal processor to said modular amplifier.

3. The amplifier system as recited in claim 2, wherein said plug-in module is also configured to add a vehicle data bus interface configured to allow said amplifier to read messages on a vehicle Controller Area Network (CAN).

4. The amplifier system as recited in claim 1, wherein said plug-in module is also configured to add a vehicle data bus interface to said modular amplifier, said vehicle data bus interface configured to allow said amplifier to read messages on a vehicle Controller Area Network (CAN) bus.

5. The amplifier system as recited in claim 1, wherein said head unit is an Original Equipment Manufacturer (OEM) head unit.

6. The amplifier system as recited in claim 1, wherein said head unit is an aftermarket head unit.

7. The amplifier system as recited in claim 1, wherein said modular amplifier adjusts a gain of said modular amplifier in response to a signal received over said data link.

8. In a vehicle sound system installed in a particular make of vehicle, said vehicle sound system having a plurality of speakers for transmitting sound, an amplifier comprising:

(a) a head unit mounted in said vehicle, said head unit outputting audio signals;

(b) a modular amplifier mounted remotely from said head unit including,
  (i) a plug-in module receiver,
  (ii) a processor,
  (iii) a memory,
  (iv) a power amplifier configured to output an amplified audio signal to said plurality of speakers,
  (v) a data link to an external vehicle data bus;

(c) a removable plug-in module configured to plug into said plug-in module receiver in said modular amplifier, including a plug-in module memory;

(d) wherein said plug-in module is configured to add a make-specific interface allowing said modular amplifier to decode signals received over said data link to said external vehicle data;

(e) an external digital device that is separate from said head unit and said modular amplifier, said external digital device running a graphical user interface, whereby a user can use said graphical user interface while said external digital device is separated from said modular amplifier to wirelessly send commands to said plug-in module, with said power amplifier responding to said commands; and (f) said commands controlling at least a gain of said power amplifier.

9. The amplifier system as recited in claim 8, wherein said head unit is an Original Equipment Manufacturer (OEM) head unit.

10. The amplifier system as recited in claim 8, wherein said head unit is an aftermarket head unit.

11. In a vehicle sound system having a plurality of speakers for transmitting sound, an amplifier system comprising:

(a) a head unit mounted in said vehicle, said head unit outputting audio signals;

(b) a modular amplifier mounted remotely from said head unit and connected to said head unit in order to receive said audio signals from said head unit, including,
  (i) a plug-in module receiver,
  (ii) a processor,
  (iii) a memory,
  (iv) a power amplifier, configured to output an amplified audio signal to said plurality of speakers,
  (v) a data link to an external vehicle data bus;

(c) a removable plug-in module configured to plug into said receiver in said modular amplifier, including a plug-in module memory;

(d) wherein said plug-in module is configured to add a digital signal processor to said modular amplifier (e) said plug-in module including a wireless communication chipset;

(f) an external digital device that is separate from said head unit and said modular amplifier, said external digital device running a graphical user interface, whereby a user can use said graphical user interface while said external digital device is physically separated from said modular amplifier to send commands to said plug-in module, with said plug-in module responding to said commands; and (g) said commands controlling at least one of an adjustable set of crossover filters, an adjustable multi-frequency band equalizer, and an adjustable delay function in said signal processing module.

12. The amplifier system as recited in claim 11, wherein said plug-in module is also configured to add a vehicle data bus interface to said modular amplifier, said vehicle data bus interface allowing said modular amplifier to read messages on said data link.

13. The amplifier system as recited in claim 11, further comprising:

(a) wherein said plug-in module includes a wireless communication chipset; and (b) wherein said external digital device sends commands to said plug-in module via said wireless chip set.

14. The amplifier system as recited in claim 11, wherein said head unit is an aftermarket head unit.

\* \* \* \* \*